United States Patent [19]

Izumiyama

[11] Patent Number: 5,705,960
[45] Date of Patent: Jan. 6, 1998

[54] BALANCED-TO-UNBALANCED CONVERTING CIRCUIT

[75] Inventor: Toru Izumiyama, Fukushima-ken, Japan

[73] Assignee: Alps Electric Co., Ltd., Tokyo, Japan

[21] Appl. No.: 812,196

[22] Filed: Mar. 6, 1997

Related U.S. Application Data

[63] Continuation of Ser. No. 538,312, Oct. 3, 1995, abandoned.

[30] Foreign Application Priority Data

Oct. 26, 1994 [JP] Japan .................................. 6-285940

[51] Int. Cl.$^6$ ........................................... H01P 5/10
[52] U.S. Cl. ........................... 333/26; 333/246; 455/327
[58] Field of Search ........................... 333/26, 246, 247; 455/326, 327

[56] References Cited

U.S. PATENT DOCUMENTS

| | | | |
|---|---|---|---|
| 4,758,922 | 7/1988 | Ishigaki et al. | 333/246 X |
| 4,949,398 | 8/1990 | Maas | 455/326 |
| 5,387,888 | 2/1995 | Eda et al. | 333/247 |

*Primary Examiner*—Paul Gensler
*Attorney, Agent, or Firm*—Guy W. Shoup; Patrick T. Bever

[57] ABSTRACT

A balanced-to-unbalanced converting circuit in which balanced-to-unbalanced converters are formed by a stripline in such a manner as to include a copper foil pattern which is formed on an inner or surface printed circuit layer of a multi-layer substrate and are connected to a double balanced mixer serving as a surface-mounted component provided on a first printed circuit. In the case of this converting circuit, a part of conventional surface-mounted components are eliminated from the multi-layer substrate. Thereby, the high density packaging of other surface-mounted components can be achieved. This contributes to the miniaturization, thickness reduction, weight reduction and price reduction of an entire portable telephone. Further, the balanced-to-unbalanced converters are formed by placing the copper foil pattern on a printed circuit layer which is sandwiched between grounded conductor layers of the multi-layer substrate. Thereby, the electrical connection between the balanced-to-unbalanced converters and the interference therebetween can be reduced. Consequently, the performance of the circuit can be improved.

3 Claims, 4 Drawing Sheets

5,705,960

BALANCED-TO-UNBALANCED CONVERTING CIRCUIT

This application is a continuation of application Ser. No. 08/538,312, filed Oct. 3, 1995, now abandoned.

BACKGROUND OF THE INVENTION

1. Field of the Invention

This invention generally relates to a balanced-to-unbalanced converting circuit, and more particularly to a balanced-to-unbalanced converting circuit which is for use in a portable transmitter-receiver or the like and consists of a balanced circuit, an unbalanced circuit and a balanced-to-unbalanced converter for connecting the balanced circuit and the unbalanced circuit.

2. Description of the Related Art

FIG. 4 is a diagram illustrating a primary part of a surface-mounted type multi-layer substrate 1 for use in a portable telephone. Reference numeral 1a designates a first printed circuit layer; 1c a third printed circuit layer for connecting mainly electric power and control signals among circuits; 1b a first conductor layer for grounding and for shielding the printed circuit layers 1a and 1c; and 1d a second conductor layer for grounding and for the prevention of interference from other digital circuits (not shown) to the substrate. Further, insulating layers are provided between the layers 1a and 1b, between the layers 1b and 1c and between the layers 1c and 1d, respectively. However, the drawing of the insulating layers is omitted herein. Further, reference numeral 2 identifies a double balanced mixer integrated circuit (IC), namely, what is called a Gilbert mixer IC which composes a frequency converting circuit (to be described later) and is constituted by a balanced circuit; and reference numeral 3 identifies a conventional balanced-to-unbalanced converter that is a surface-mounted component formed by winding a wire around a ferrite material, in which two holes are bored, and mounted on a resin pedestal 3a. Incidentally, FIG. 5 is a circuit diagram for illustrating the configuration of the conventional balanced-to-unbalanced converter 3. Further, a converting operation of this converter is publicly known. Thus the description of this converting operation is omitted.

FIG. 6 is a block diagram for illustrating the configuration of a frequency converting circuit of a transmitting portion of a portable telephone. As is seen from this figure, an intermediate frequency (IF) signal amplified by the IF amplifier 4 is inputted to IF input terminals 2a and 2b of a double balanced mixer 2. Generally, most IF amplifiers are constituted by ICs. In the cases of most of such IF amplifiers, outputs of the ICs thereof are balanced output signals (namely, such IF amplifiers are balanced circuits). Thus balanced-to-unbalanced converters need not be connected to the terminals 2a and 2b. In contrast, local oscillation signals, the phases of which are different from each other by 180 degrees, need to be inputted to local-oscillation-signal input terminals 2c and 2d of the double balanced mixer 2. Such local oscillation signals are supplied from a local oscillation circuit 5 consisting of a phase-locked loop (PLL) IC and a voltage-controlled oscillator (VCO) circuit. In most of such cases, the signal supplied from the local oscillation circuit 5 is an unbalanced signal acting as a single-ended output signal (namely, the local oscillation circuit is an unbalanced circuit). Thus it is necessary to convert the unbalanced signal into a balanced signal. For that purpose, a balanced-to-unbalanced converter 3 is used.

On the other hand, a radio frequency (RF) signal obtained by a conversion using the IF signal and the local oscillation signal is outputted from RF output terminals 2e and 2f of the double balanced mixer 2 as balanced output signals. Thereafter, such an output signal is supplied to a bandpass filter 6 in order to eliminate an unnecessary spurious signal therefrom. Here, note that the bandpass filter is constituted by a surface acoustic wave (SAW) filter or the like and generally, an unbalanced input signal should be inputted to this bandpass filter (namely, this bandpass filter is an unbalanced circuit). Therefore, the RF balanced signals outputted from the terminals 2e and 2f need to be converted by the balanced-to-unbalanced converter 3 into unbalanced input signals. Incidentally, the IF amplifier 4, the local oscillation circuit 5, the bandpass filter and so on as illustrated in FIG. 6 are surface-mounted type components and are mounted on the first printed circuit layer 1a, similarly as the double balanced mixer 2.

Generally, the miniaturization and weight reduction of a portable telephone are problems of highest priority. Moreover, high-performance low-price portable telephones are required. It is well known that double balanced mixers, which excel in distortion characteristics such as intermodulation distortion characteristics and have a high degree of suppression of a local oscillation signal, are best-suited as components to be used as frequency converting circuits for use in receiving and transmitting circuits. Thus, the receiving and transmitting circuits use four to six balanced-to-unbalanced converters. As technology progresses, the integration of the circuit of and the miniaturization of the package of the double balanced mixer have been advanced. Thus the miniaturization and weight reduction of the double balanced mixer have continued up to the present. In contrast, the minimum size of the presently available balanced-to-unbalanced converter made of the ferrite material is about 5 mm by 5 mm or so. This has become an impediment to the miniaturization, thickness reduction and weight reduction of a portable telephone. Moreover, the balanced-to-unbalanced converter made of the ferrite material requires a step of winding a wire around the ferrite material. Additionally, it is further necessary for forming the circuit as a surface-mounted component to mount the balanced-to-unbalanced converter on the resin pedestal 3a. This results in costly assembly of the component. Furthermore, it is necessary to mount such components on a substrate. This has become a hindrance to price reduction.

Further, in the case where the conventional balanced-to-unbalanced converters are mounted on the first printed circuit layer of the multi-layer substrate, necessary connections between components occur when placing the mounted components as densely as possible in order to reduce the size of the entire circuit. Especially, in the case where a connection between the balanced-to-unbalanced converters respectively provided on the local-oscillation-circuit side and the RF-output side of the double balanced mixer occurs, the leakage of unnecessary local oscillation signals from the RF-output side thereof increases. Thus the high density packaging can not be realized. Consequently, the miniaturization of the circuit is difficult in the case of using the conventional balanced-to-unbalanced converters.

Accordingly, an object of the present invention is to resolve the aforementioned problems of the conventional circuit.

SUMMARY OF THE INVENTION

To achieve the foregoing object, in accordance with an aspect of the present invention, there is provided a balanced-to-unbalanced converting circuit which comprises one or more balanced circuits, one or more unbalanced circuits and one or more balanced-to-unbalanced converters for connecting the balanced circuits with the unbalanced circuits. In this balanced-to-unbalanced converting circuit, the balanced circuits and the unbalanced circuits are placed on the outermost printed circuit layer of the multi-layer substrate. Further, the balanced-to-unbalanced converter is formed on the surface printed circuit layer (namely, the outermost printed circuit layer) or an inner printed circuit layer by using a stripline. Moreover, at least one of the conductor layers respectively placed above and under the printed circuit layer, on which the balanced-to-unbalanced converter is formed, is grounded.

In the case of a practical embodiment of the present invention (for example, an embodiment of FIG. 1 which is described below), balanced-to-unbalanced converters (respectively corresponding to 7a and 7b of FIG. 1) are formed as a stripline by forming a copper foil pattern on an inner printed circuit layer which is sandwiched by upper and lower grounded conductor layers (respectively corresponding to 1b and 1d of FIG. 1). Thus a transmission circuit is formed between each of the converters and the corresponding grounded conductor layer. Consequently, the electrical connection therebetween, as well as the interference therebetween, can be reduced.

Further, if the balanced-to-unbalanced converters are respectively formed on different (kinds of) inner printed circuit layers (not shown) sandwiched between the upper and lower grounded conductor layers, the balanced-to-unbalanced converters come to be placed by being shielded independent of each other. Thus the effects of reducing the electrical connection therebetween and of decreasing the interference therebetween can be further enhanced.

Moreover, even in the case of forming the balanced-to-unbalanced converters on the surface printed circuit layer, a first conductor layer is a grounded layer. Thus the effects of reducing the electrical connection therebetween and of decreasing the interference therebetween can be obtained, though such effects are of a degree lower than that of the effects obtained in the case where the balanced-to-unbalanced converters are formed on the inner printed circuit layer.

Thus the problem of the conventional circuit, namely, a hindrance to the miniaturization, which occurs owing to the connection and interference between the components even though the high density packaging is desired, can be eliminated. Consequently, the miniaturization and thickness reduction of the circuit can be achieved by maintaining the high performance thereof.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

Figure 1:
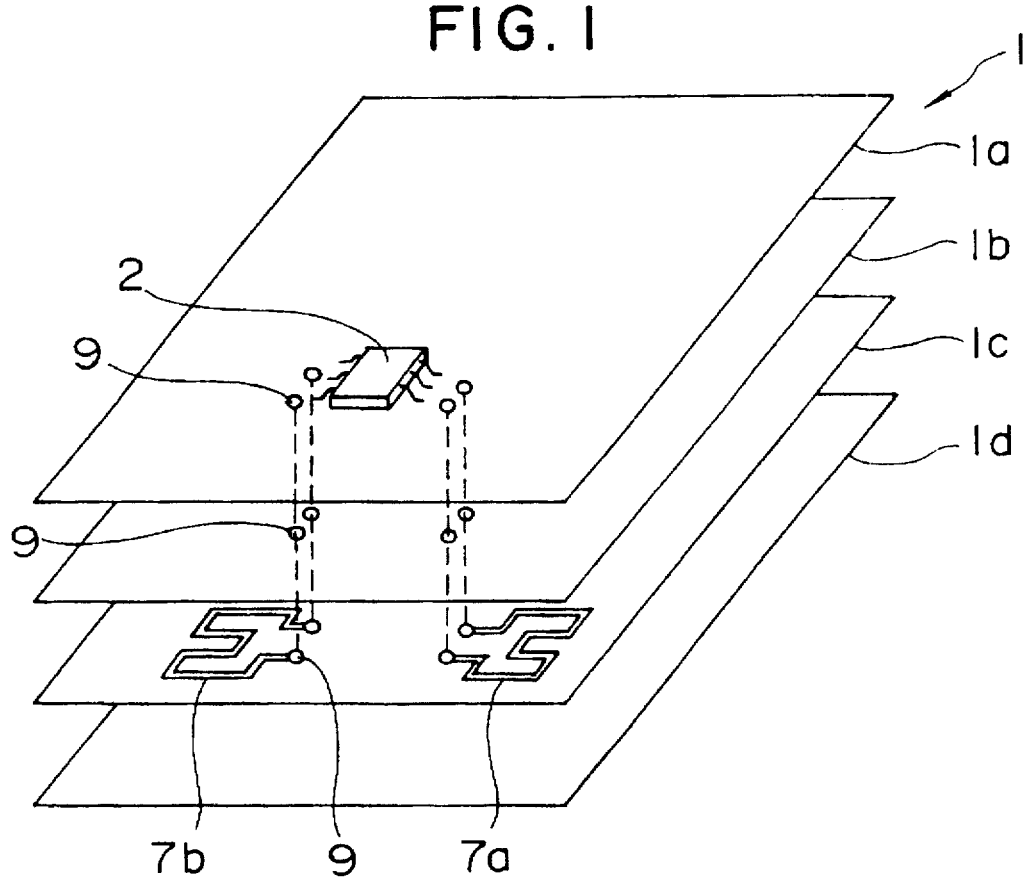
FIG. 1 is a diagram for illustrating a balanced-to-unbalanced converting circuit embodying the present invention, in which balanced-to-unbalanced converters are provided in a multi-layer substrate.
Figure 4:
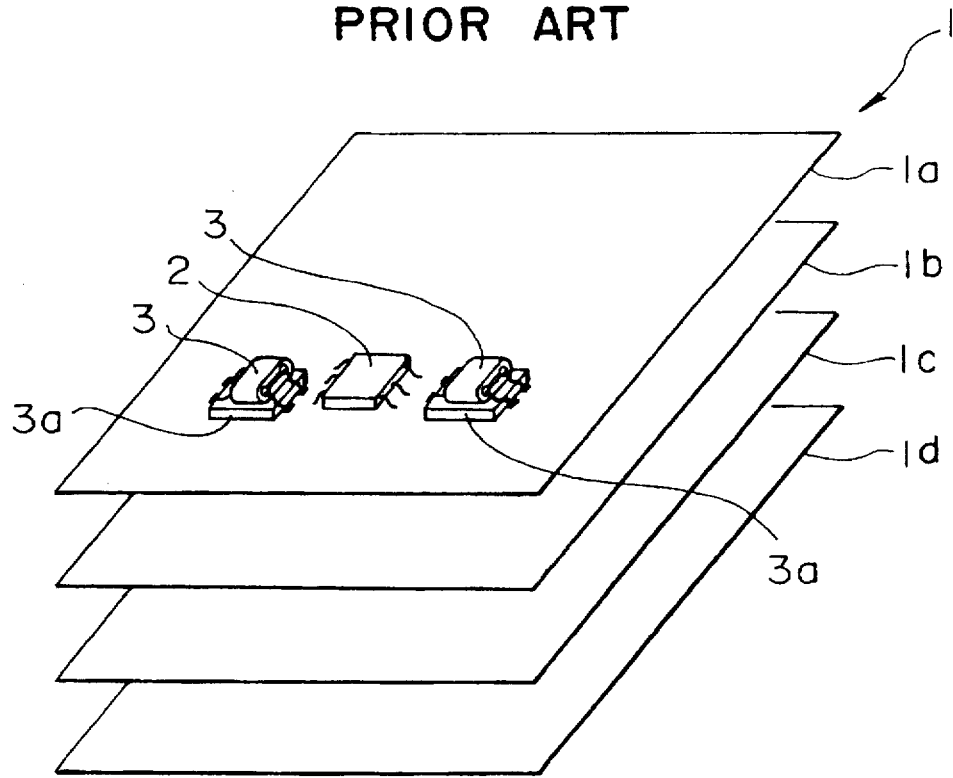
FIG. 4 is a diagram for illustrating a multi-layer substrate in which conventional balanced-to-unbalanced converters are provided.
Figure 5:
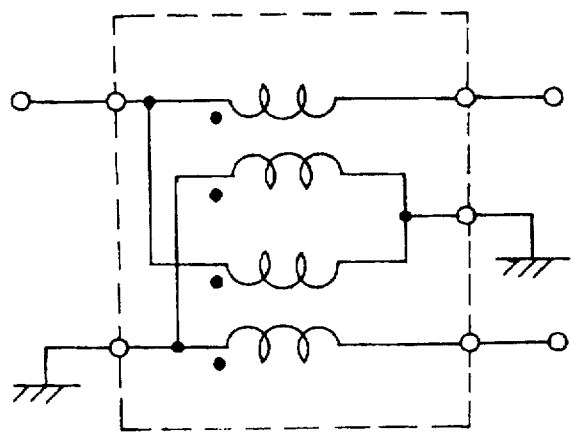
FIG. 5 is a circuit diagram of the conventional balanced-to-unbalanced converter.

FIG. 1 illustrates a balanced-to-unbalanced converting circuit embodying the present invention, namely, an embodiment of the present invention. This balanced-to-unbalanced converting circuit is different from the conventional circuit of FIG. 4 in that balanced-to-unbalanced converters 7a and 7b are formed as a stripline by forming a copper foil pattern on a second printed circuit layer 1c instead of the balanced-to-unbalanced converters 3 formed as surface-mounted components on the first printed circuit layer (namely, the outermost layer) 1a of the multi-layer substrate 1 of the conventional circuit, that the copper foil pattern of the balanced-to-unbalanced converters 7a and 7b are sandwiched between grounded conductor layers 1b and 1d which are provided above and under the second printed circuit layer 1c and that the balanced-to-unbalanced converters 7a and 7b are connected with the double balanced mixer 2, which is provided on the first printed circuit layer 1a, via through holes 9 (which are insulated from the first grounded conductor layer 1b).

Figure 7:
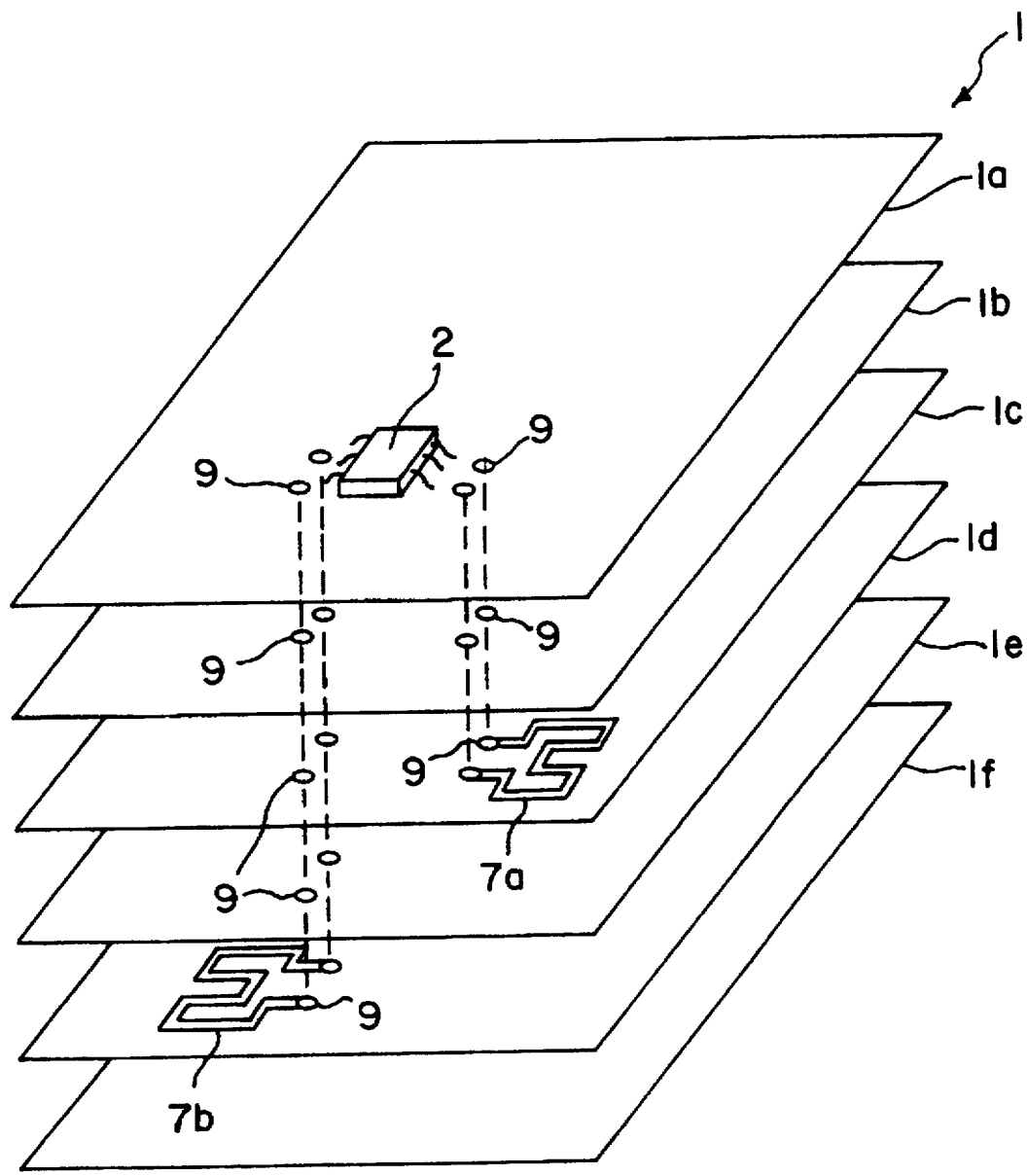
FIG. 7 is a diagram illustrating a balanced-to-unbalanced converting circuit embodying the present invention, in which balanced-to-unbalanced converters are provided on separate printed circuit layers of a multilayer substrate.

Incidentally, in the foregoing description, the balanced-to-unbalanced converter 7a, which corresponds to the local-oscillation-circuit side, and the balanced-to-unbalanced converter 7b, which corresponds to the RF-output side, are described as being formed on the same inner conductive layer 1c. However, as shown in FIG. 7, the balanced-to-unbalanced converters 7a and 7b may be formed on different inner printed circuit layers 1c and 1e, respectively, with the third printed circuit layer 1e being sandwiched between the second and third grounded conductor layers 1d and 1f, if necessary. Moreover, the balanced-to-unbalanced converters used in this circuit of the present invention may be placed and formed on the outermost layer (namely, on the surface printed circuit layer) of the multi-layer substrate, if necessary.

Figure 2A:
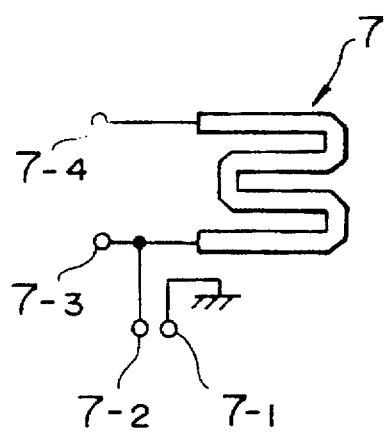
FIGS. 2A and 2B are circuit diagrams for illustrating the balanced-to-unbalanced converters used in the balanced-to-unbalanced converting circuit embodying the present invention.
Figure 2B:
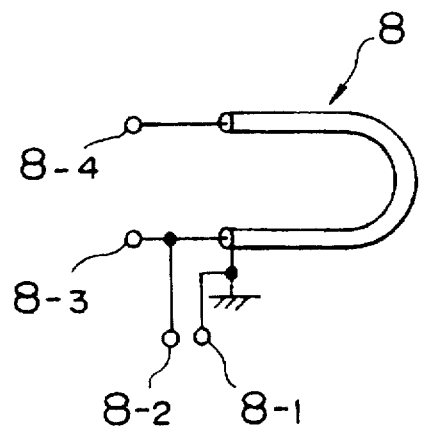

FIG. 2B is a diagram for illustrating the balanced-to-unbalanced converter to be used in the circuit of the present invention. As shown in this figure, this balanced-to-unbalanced converter is of the known narrowband coaxial-structure type. Further, this converter has the length adjusted to $\lambda/2$ (incidentally, $\lambda$ designates the wavelength of a high frequency signal to be handled) and is bent like a character "U". Here, note that when unbalanced signals are inputted to a grounding terminal 8-1 and an unbalanced input terminal 8-2, a signal having a same phase as the phase of the unbalanced signal at the unbalanced input terminal 8-2 appears at a terminal 8-3, because the terminal 8-3 and the terminal 8-2 are equivalent to each other in respect of the phase of the unbalanced signal. Further, a signal having a phase different from the phase of the unbalanced signal at the unbalanced input terminal 8-2 by 180 degrees appears at a terminal 8-4, because the distance or length measured along the U-shaped converter between the terminals 8-2 and 8-4 is longer than the distance between the terminals 8-2 and 8-3 by $\lambda/2$. Therefore, the phases of the signals outputted from (or inputted to) the terminals 8-3 and 8-4 come to be different from each other by 180 degrees.

Thus a balanced-to-unbalanced converter 7 of FIG. 2A is obtained by changing the structure from the coaxial structure to a stripline structure in order that this converter is formed or provided in a plane on the printed circuit layer of the multi-layer substrate. Each of the terminals 7-1 through 7-4 of the balanced-to-unbalanced converter 7 of FIG. 2A corresponds respectively to the terminals 8-1 through 8-4 of the balanced-to-unbalanced converter 8 of FIG. 2B. Further, the length of the stripline of this converter is adjusted to $\lambda/2$, similarly as in the case of the converter 8. It is needless to say that the physical length of the stripline is determined by taking into account and estimating the wavelength contracting rate from the dielectric constants of insulating layers of the multi-layer substrate. Moreover, it has been known that the width of the stripline is determined by the distance between the upper and lower grounding layers and the predetermined characteristic impedance thereof. Thus the descriptions of the determination of the length and width of the stripline are omitted. Incidentally, the balanced-to-unbalanced converter used in the circuit is not limited to the converter 7 of FIG. 2A. For example, the balanced-to-unbalanced converter may be constituted by two parallel striplines. Alternatively, various modifications of this balanced-to-unbalanced converter may be used.

Figure 3:
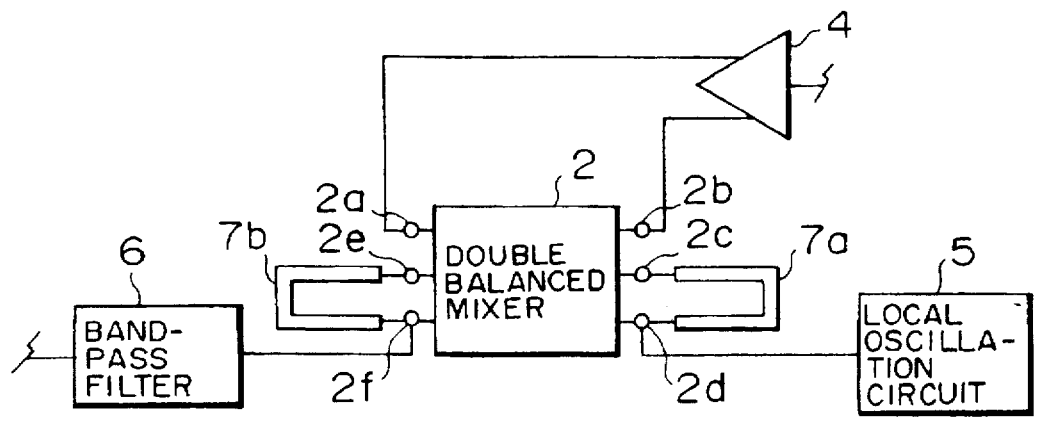
FIG. 3 is a block diagram for illustrating a frequency converting circuit in which the balanced-to-unbalanced converters of the present invention connected to a double balanced mixer are provided.
Figure 6:
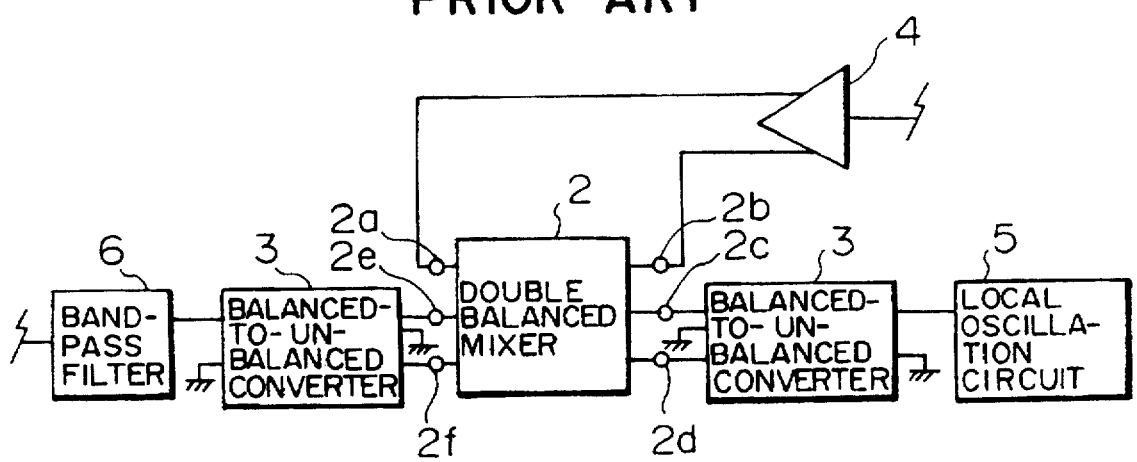
FIG. 6 is a block diagram for illustrating a frequency converting circuit in which the conventional balanced-to-unbalanced converters connected to a double balanced mixer are provided.

FIG. 3 is a block diagram for illustrating the configuration of a frequency converting circuit of a transmitting portion, which is another embodiment of the present invention. The frequency converting circuit of FIG. 3 is different from the conventional circuit of FIG. 6 only in that the conventional balanced-to-unbalanced converters 3 are replaced with the balanced-to-unbalanced converters 7a and 7b of the present invention, respectively. The remaining components of the circuit of FIG. 3 are the same as the corresponding components of the conventional circuit of FIG. 6. Therefore, the detail descriptions of the configuration of the circuit are omitted. Incidentally, the conventional balanced-to-unbalanced converters 3 are of the broadband type. Thus, common balanced-to-unbalanced converters are used as the converter corresponding to the local-oscillation-circuit side and the converter corresponding to the RF-output side of the mixer. In contrast, the balanced-to-unbalanced converters used in the circuit of the present invention are of the narrowband type. Therefore, each of the converters 7a and 7b is obtained or optimized by adjusting the length of the stripline thereof to the wavelength of a signal to be handled by the circuit.

Thus, in the case of the circuit of the present invention, all of the balanced-to-unbalanced converters mounted on the multi-layer substrate are constructed by forming a copper foil pattern on the inner or outermost printed circuit layer of the multi-layer substrate in such a manner as to form a stripline. This makes a great contribution to the miniaturization, thickness reduction and weight reduction of the entire portable telephone. Further, in the case of the circuit of the present invention, the copper foil pattern of the balanced-to-unbalanced converters can be mounted therein by being sandwiched between the upper and lower grounded layers. Moreover, the balanced-to-unbalanced converters can be mounted on the different (kinds of) inner layers, respectively. Thereby, the unnecessary combination between the converters, as well as the interference therebetween, can be reduced. Thus, higher density packaging can be realized. Consequently, the miniaturization of the circuit can be achieved. Especially, in the case where spurious signals outputted from the circuit should be suppressed similarly as in the case of the frequency converting circuit embodying the present invention, the advantages of the present invention become pronounced. Furthermore, in the case of the circuit of the present invention, the necessity of using the balanced-to-unbalanced converters formed as separate components can be obviated. This contributes much toward lowering the price of the portable telephone.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A balanced-to-unbalanced converting circuit comprising:

a multi-layered substrate including an outermost printed circuit layer, a first grounded conductor layer and a second printed circuit layer sandwiched such that the first grounded conductor layer is located between the outermost printed circuit layer and the second printed circuit layer;

a balanced circuit mounted on the outermost printed circuit layer;

an unbalanced circuit mounted on the outermost printed circuit layer; and a balanced-to-unbalanced converter connected between the balanced circuit and the unbalanced circuit;

wherein the balanced-to-unbalanced converter includes a stripline formed by a foil pattern formed on the second printed circuit layer, and by the first grounded conductor layer; and wherein the foil pattern is connected to the balanced circuit and the unbalanced circuit through openings formed in the first grounded conductor layer.

2. The balanced-to-unbalanced converting circuit according to claim 1, further comprising:

a second balanced-to-unbalanced converter including a second stripline formed by a second foil pattern formed on the second printed circuit layer, and the first grounded conductor layer;

wherein the second foil pattern is connected to the balanced circuit through second openings formed in the first grounded conductor layer.

3. The balanced-to-unbalanced converting circuit according to claim 1, further comprising:

a second grounded conductor layer and a third printed circuit layer such that the second grounded conductor layer is located between the second and third printed circuit layers;

a second balanced-to-unbalanced converter including a second stripline formed by a second foil pattern formed on the third printed circuit layer, and by the second grounded conductor layer;

wherein the second foil pattern is connected to the balanced circuit through second openings formed in the first grounded conductor layer, the second printed circuit layer, and the second grounded conductor layer.

* * * * *

UNITED STATES PATENT AND TRADEMARK OFFICE
CERTIFICATE OF CORRECTION

PATENT NO. :   5,705,960
DATED      :   January 6, 1998
INVENTOR(S) :  Toru Izumiyama It is certified that error appears in the above-indentified patent and that said Letters Patent is hereby corrected as shown below:

ON THE TITLE PAGE:

In column 2, line 7, "UNDER ABSTRACT", after the first occurrence of "circuit", please insert --layer--.

Signed and Sealed this

Nineteenth Day of January, 1999

Attest:

Attesting Officer

*Acting Commissioner of Patents and Trademarks*